US010203599B2

(12) United States Patent
Kim et al.

(10) Patent No.: US 10,203,599 B2
(45) Date of Patent: Feb. 12, 2019

(54) PHOTOSENSITIVE COMPOSITIONS, QUANTUM DOT POLYMER COMPOSITE PATTERN PREPARED THEREFROM, AND ELECTRONIC DEVICES INCLUDING THE SAME

(71) Applicants: SAMSUNG ELECTRONICS CO., LTD., Suwon-si, Gyeonggi-do (KR); Samsung SDI Co., Ltd., Yongin-si, Gyeonggi-do (KR)

(72) Inventors: Jonggi Kim, Suwon-si (KR); Shang Hyeun Park, Yongin-si (KR); Shin Ae Jun, Seongnam-si (KR); Hojeong Paek, Suwon-si (KR)

(73) Assignees: SAMSUNG ELECTRONICS CO., LTD., Gyeonggi-Do (KR); SAMSUNG SDI CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/295,373

(22) Filed: Oct. 17, 2016

(65) Prior Publication Data
US 2017/0115562 A1  Apr. 27, 2017

(30) Foreign Application Priority Data
Oct. 22, 2015 (KR) .................. 10-2015-0147611

(51) Int. Cl.
*G03F 7/028* (2006.01)
*G03F 7/033* (2006.01)
(Continued)

(52) U.S. Cl.
CPC .......... *G03F 7/0007* (2013.01); *G03F 7/0047* (2013.01); *G03F 7/028* (2013.01);
(Continued)

(58) Field of Classification Search
None
See application file for complete search history.

(56) References Cited

U.S. PATENT DOCUMENTS 7,199,393 B2   4/2007  Park et al.
7,306,899 B2  12/2007  Wu
(Continued)

FOREIGN PATENT DOCUMENTS

JP  2015-018226  *  1/2015  ............. G03F 7/075
KR   100697511 B1    3/2007
(Continued)

OTHER PUBLICATIONS

Barkhouse et al., "Thiols passivate recombination centers in colloidal quantum dots leading to enhanced photovoltaic device efficiency", ACSnano vol. 2(11) pp. 2356-2362 (2008).*

*Primary Examiner* — Martin J Angebranndt
(74) *Attorney, Agent, or Firm* — Cantor Colburn LLP

(57) ABSTRACT

A photosensitive composition includes a plurality of quantum dots including an organic ligand on the surface thereof; a binder; a photopolymerizable monomer composition; photoinitiator; and a solvent, wherein the photopolymerizable monomer includes a main monomer having 1 to 6 carbon-carbon double bonds, a first accessory monomer having 8 to 20 carbon-carbon double bonds, and a second accessory monomer represented by Chemical Formula A; and a method of preparing the photosensitive composition and a quantum dot-polymer composite pattern prepared therefrom are provided:

$R^1O\text{-}(L_1)_m\text{-}L_3\text{-}A\text{-}L_4\text{-}(L_2)_n\text{-}OR^2$   Chemical Formula A wherein, A, $L_1$, $L_2$, $L_3$, $L_4$, $R^1$, and $R^2$ are the same as defined herein.

14 Claims, 5 Drawing Sheets
(3 of 5 Drawing Sheet(s) Filed in Color)

(51) Int. Cl.
  *G03F 7/20*   (2006.01)
  *G03F 7/32*   (2006.01)
  *G03F 7/00*   (2006.01)
  *G03F 7/16*   (2006.01)
  *G03F 7/004*  (2006.01)

(52) U.S. Cl.
  CPC .............. *G03F 7/033* (2013.01); *G03F 7/162* (2013.01); *G03F 7/20* (2013.01); *G03F 7/322* (2013.01)

(56) References Cited

U.S. PATENT DOCUMENTS

| | | | |
|---|---|---|---|
| 7,476,487 B2 | 1/2009 | Park et al. | |
| 7,875,416 B2 | 1/2011 | Park et al. | |
| 7,939,244 B2 | 5/2011 | Xu et al. | |
| 8,211,597 B2* | 7/2012 | Su | B22F 1/0096 430/281.1 |
| 8,642,991 B2 | 2/2014 | Park et al. | |
| 8,758,864 B2 | 6/2014 | Park et al. | |
| 8,911,883 B2 | 12/2014 | Park et al. | |
| 2006/0166132 A1 | 7/2006 | Meagley | |
| 2007/0231735 A1* | 10/2007 | Pawlowski | G03F 7/027 430/270.1 |
| 2010/0104981 A1* | 4/2010 | Choi | G03F 7/0007 430/286.1 |
| 2012/0225969 A1* | 9/2012 | Miyabayashi | C08F 290/067 522/53 |
| 2014/0080061 A1 | 3/2014 | Redinger et al. | |
| 2015/0056413 A1* | 2/2015 | Hwang | G02B 1/04 428/156 |
| 2016/0215213 A1* | 7/2016 | Lee | C09K 11/883 |
| 2017/0052444 A1* | 2/2017 | Park | B82Y 20/00 |
| 2017/0059988 A1* | 3/2017 | Paek | G03F 7/0007 |
| 2017/0176854 A1* | 6/2017 | Park | G03F 7/0043 |
| 2017/0183565 A1* | 6/2017 | Jun | C09K 11/025 |
| 2017/0240728 A1* | 8/2017 | Lee | H01L 51/5262 |
| 2018/0044586 A1* | 2/2018 | Kwon, II | C09K 11/08 |

FOREIGN PATENT DOCUMENTS

| | | | |
|---|---|---|---|
| KR | 101435195 B1 | 8/2014 | |
| WO | 2016/134820 | * 9/2016 | ............. G03F 7/075 |

* cited by examiner

PHOTOSENSITIVE COMPOSITIONS, QUANTUM DOT POLYMER COMPOSITE PATTERN PREPARED THEREFROM, AND ELECTRONIC DEVICES INCLUDING THE SAME

CROSS-REFERENCE TO RELATED APPLICATION

This application claims priority to and the benefit of Korean Patent Application No. 10-2015-0147611 filed in the Korean Intellectual Property Office on Oct. 22, 2015, and all benefits accruing therefrom under 35 U.S.C. § 119, the entire content of which is incorporated herein by reference.

BACKGROUND

1. Field

Photosensitive compositions, quantum dot-polymer composite patterns prepared therefrom, and electronic devices including the same are disclosed.

2. Description of the Related Art

A liquid crystal display (hereinafter, LCD) is a display in which polarized light passed through liquid crystal express a color while passing through an absorption type color filter. Unfavorably, LCD has a narrow viewing angle and a low luminance due to low light transmittance of the absorption type color filter. By using a photoluminescent type color filter instead of the absorption type color filter, it is expected to widen the viewing angle and to improve the luminance.

Quantum dots (QD) are dispersed in a polymer host matrix, so it is applicable for the various display devices in a form of a composite. Quantum dots are dispersed in a host matrix of an inorganic material or a polymer, so it may be used as a light conversion layer in a light emitting diode (LED) or the like. When quantum dots are colloid-synthesized, the particle size may be relatively freely controlled and also uniformly controlled. When quantum dots have a size of less than or equal to about 10 nanometers (nm), the quantum confinement effects in which the bandgap is more increased according to decreasing a size become significant, thus the energy density is enhanced. As quantum dots have a theoretical quantum yield (QY) of 100% and may emit light having a high color purity (e.g., full width at half maximum (FWHM) of less than or equal to about 40 nm), it may enhance a luminous efficiency and improve a color reproducibility. Accordingly, the pattern of a composite including quantum dots is applicable for the various devices. For example, a color filter for a liquid crystal display including quantum dot-polymer composite pattern is expected to contribute the development of a high quality photoluminescent type LCD.

In order to accomplish this, however, techniques of patterning the quantum dot-polymer composite are desired.

SUMMARY

An embodiment provides a photosensitive composition capable of preparing a pattern of a quantum dot-polymer composite.

Another embodiment provides a pattern of a quantum dot-polymer composite prepared from the composition.

Yet another embodiment provides an electronic device including the pattern of the quantum dot-polymer composite.

In an embodiment, a photosensitive composition includes
a plurality of quantum dots including an organic ligand on a surface thereof;
a binder;
as a photopolymerizable monomer composition;
a photoinitiator; and
a solvent,
wherein the photopolymerizable monomer composition includes a main monomer having 1 to 6 carbon-carbon double bonds, a first accessory monomer having 8 to 20 carbon-carbon double bonds, and a second accessory monomer represented by Chemical Formula A:

$$R^1O\text{-}(L_1)_m\text{-}L_3\text{-}A\text{-}L_4\text{-}(L_2)_n\text{-}OR^2 \qquad \text{Chemical Formula A}$$

wherein, A is a C1 to C40 aliphatic hydrocarbon group, a C6 to C40 aromatic hydrocarbon group, a divalent moiety including two or more C6 to C40 aromatic hydrocarbon groups linked by a substituted or unsubstituted C1 to C10 alkylene, an ether, or a combination thereof, or an ether (—O—), $L_1$ and $L_2$ are each independently the same or different, and are a substituted or unsubstituted C2 to C5 oxyalkylene, m and n are an integer of 0 to 20, provided that they are not simultaneously 0, $L_3$ and $L_4$ are each independently the same or different, and are a direct bond, —O—$(CH_2)_n$—CH(OH)—$CH_2$—, or —$(CH_2)_n$—CH(OH)—$CH_2$—, and $R^1$ and $R^2$ are the same or different, and are each independently $CR_2$=CR— (wherein, R is hydrogen or a methyl group) or $CR_2$=CRCO— (wherein, R is hydrogen or a methyl group).

The organic ligand may include RCOOH, $RNH_2$, $R_2NH$, $R_3N$, RSH, $R_3PO$, $R_3P$, ROH, RCOOR', $RPO(OH)_2$, $R_2POOH$ (wherein, R and R' are independently a C5 to C24 aliphatic hydrocarbon group or a C5 to C20 aromatic hydrocarbon group), a polymeric organic ligand, or a combination thereof.

The quantum dot may include a Group II-VI compound, a Group III-V compound, a Group IV-VI compound, a Group IV compound, a Group compound, a Group I-II-IV-VI compound, or a combination thereof, wherein "Group" refers to the Period Table of the Elements.

The binder may be a carboxyl group-containing resin.

The carboxyl group-containing resin may be a copolymer of a monomer mixture including a first monomer having a carboxyl group and a carbon-carbon double bond and a second monomer having a carbon-carbon double bond and a hydrophobic moiety and not having a carboxyl group.

The plurality of quantum dots may be dispersed by the binder.

The carboxyl group-containing binder may be a copolymer of a monomer mixture that further includes a third monomer having a carbon-carbon double bond and a hydrophilic moiety and not having a carboxyl group.

The carboxyl group-containing binder may have an acid value of greater than or equal to about 50 mg KOH/g.

The main monomer may include a (C1 to C6 alkyl) (meth)acrylate, ethylene glycol di(meth)acrylate, triethylene glycol di(meth)acrylate, diethylene glycol di(meth)acrylate, 1,4-butanediol di(meth)acrylate, 1,6-hexanediol di(meth)acrylate, neopentylglycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol penta(meth)acrylate, pentaerythritol hexa(meth)acrylate, trimethylol propane tri(meth)acrylate, ethylene glycol monomethylether (meth)acrylate, novolac epoxy (meth)

acrylate, diethylene glycol di(meth)acrylate, triethylene glycol di(meth)acrylate, propylene glycol di(meth)acrylate, tris (meth)acryloyloxyethyl phosphate, or a combination thereof.

The first accessory monomer may include a hyperbranched (meth)acrylate monomer.

The first accessory monomer may include a dendrimer (meth)acrylate monomer.

The first accessory monomer may include 1 to 4 hydroxy groups.

The second accessory monomer may include bisphenol A di(meth)acrylate, bisphenol A epoxy (meth)acrylate, a bisphenol A ethylene glycol di(meth)acrylate monomer, or a combination thereof.

An amount of the main monomer may be about 60 wt % to about 90 wt %, and the sum of the first accessory monomer and the second accessory monomer may be about 10 wt % to about 40 wt % based on the total weight of the photopolymerizable monomer mixture, and an amount of the second accessory monomer may be less than or equal to about 100 parts by weight per 100 parts by weight of the first accessory monomer.

The photosensitive composition may further include a reactive compound represented by Chemical Formula 1:

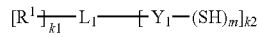

wherein, in Chemical Formula 1, $R^1$ is selected from hydrogen; a substituted or unsubstituted C1 to C30 linear or branched alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a C1 to C10 alkoxy group; a hydroxy group; —$NH_2$; a substituted or unsubstituted C1 to C30 amine group (—NRR', wherein R and R' are independently hydrogen or a C1 to C30 linear or branched alkyl group); an isocyanate group; a halogen; —ROR' (wherein R is a substituted or unsubstituted C1 to C20 alkylene group R' is hydrogen or C1 to C20 linear or branched alkyl group); an acyl halide (—RC(=O)X, wherein R is a substituted or unsubstituted alkylene group and X is a halogen); —C(=O)OR' (wherein R' is hydrogen or a C1 to C20 linear or branched alkyl group); —CN; —C(=O)ONRR' (wherein R and R' are independently hydrogen or a C1 to C20 linear or branched alkyl group), or a combination thereof, $L_1$ is a carbon atom, a substituted or unsubstituted C1 to C30 alkylene group, a substituted or unsubstituted C6 to C30 cycloalkylene group, a substituted or unsubstituted C6 to C30 arylene group, or a substituted or unsubstituted C6 to C30 heteroarylene group, wherein at least one methylene (—$CH_2$—) of the substituted or unsubstituted C1 to C30 alkylene group may be replaced by a sulfonyl (—$SO_2$—), a carbonyl (CO), an ether (—O—), a sulfide (—S—), a sulfoxide (—SO—), an ester (—C(=O)O—), an amide (—C(=O)NR—) (wherein R is hydrogen or C1 to C10 alkyl group), or a combination thereof, $Y_1$ is a single bond; a substituted or unsubstituted C1 to C30 alkylene group; a substituted or unsubstituted C2 to C30 alkenylene group; or a C1 to C30 alkylene group or a C2 to C30 alkenylene group wherein at least one methylene (—$CH_2$—) is replaced by a sulfonyl (—$S(=O)_2$—), a carbonyl (—C(=O)—), an ether (—O—), a sulfide (—S—), a sulfoxide (—S(=O)—), an ester (—C(=O)O—), an amide (—C(=O)NR—) (wherein R is hydrogen or a C1 to C10 linear or branched alkyl group), an imine (—NR—) (wherein R is hydrogen or a C1 to C10 linear or branched alkyl group), or a combination thereof, m is an integer of 1 or more, k1 is 0 or an integer of 1 or more, k2 is an integer of 1 or more, and the sum of m and k2 is an integer of 3 or more, provided that m does not exceed the valence of $Y_1$ when $Y_1$ is not a single bond and provided that the sum of k1 and k2 does not exceed the valence of $L_1$.

The reactive compound may be ethoxylated pentaerythritol tetra(3-mercaptopropionate), trimethylolpropane tri(3-mercaptopropionate), trimethylolpropane tri(2-mercaptoacetate), glycol di-3-mercaptopropionate, polypropylene glycol di-3-mercaptopropionate, ethoxylated trimethylpropane tri (3-mercaptopropionate), glycol di mercaptoacetate, ethoxylated glycol dimercaptoacetate, 1,4-bis (3-mercaptobutyryloxy)butane, trimethylolpropane tris (3-mercaptopropionate), tris[2-(3-mercaptopropinonyloxy)ethyl]isocyanurate, 1,3,5-tris (3-mercaptobutyloxyethyl)-1,3,5-triazine-2,4,6(1H,3H,5H)-trione, pentaerythritol tetrakis (3-mercaptopropionate), pentaerythritol tetrakis (2-mercaptoacetate), 1,6-hexanedithiol, 1,3-propanedithiol, 1,2-ethanedithiol, a polyethylene glycol dithiol including 1 to 10 of ethylene glycol repeating units, or a combination thereof.

The photosensitive composition may be developable by an alkali aqueous solution.

The photosensitive composition may further include a light diffusing agent selected from a metal oxide particle, a metal particle, and a combination thereof.

The photosensitive composition may include
about 1 wt % to about 40 wt % of the quantum dot;
about 0.5 wt % to about 35 wt % of the binder;
about 1 wt % to about 25 wt % of the photopolymerizable monomer; and
about 0.01 wt % to about 10 wt % of the photoinitiator; and
a balance amount of the solvent based on the total weight of the composition.

When the photosensitive composition is exposed to light under a pattern and is developed, a breakpoint time to show a pattern may be less than or equal to about 60 sec.

The photosensitive composition may have critical dimension uniformity of less than or equal to about 5%.

Another embodiment provides a quantum dot-polymer composite pattern prepared from the photosensitive composition.

Yet another embodiment provides an electronic device including the quantum dot-polymer composite pattern.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

These and/or other aspects will become apparent and more readily appreciated from the following description of the embodiments, taken in conjunction with the accompanying drawings in which.

DETAILED DESCRIPTION

Figure 1:
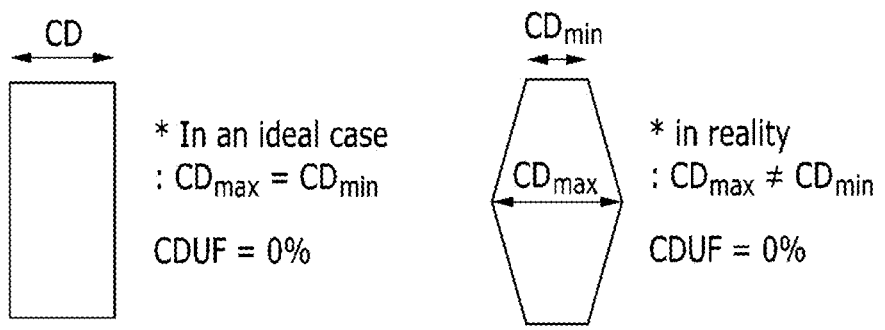
FIG. 1 is a comparative illustration of critical dimension uniformity according to an embodiment.

Advantages and characteristics of this disclosure, and a method for achieving the same, will become evident referring to the following exemplary embodiments together with the drawings attached hereto. The embodiments, may, however, be embodied in many different forms and should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising" will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, when a definition is not otherwise provided, the term "substituted" refers to a compound wherein at least one of the hydrogen atoms thereof is substituted with a substituent selected from a C1 to C30 alkyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR', wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH), or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), and a combination thereof.

As used herein, the term "monovalent organic functional group" refers to a C1 to C30 alkyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, or a C2 to C30 heterocycloalkyl group.

As used herein, when a definition is not otherwise provided, the term "hetero" refers to inclusion of one to three heteroatoms selected from the group consisting of N, O, S, Si, and P.

As used herein, the term "alkylene group" may refer to a straight or branched saturated aliphatic hydrocarbon group having a valence of at least two, optionally substituted with one or more substituents. The term "arylene group" may refer to a functional group having a valence of at least two obtained by removal of two hydrogens in an aromatic ring, optionally substituted with one or more substituents.

As used herein, the term "aliphatic organic group" refers to a C1 to C30 linear or branched alkyl group, the term "aromatic organic group" refers to a C6 to C30 aryl group or C2 to C30 heteroaryl group, and the term refers to a "alicyclic organic group" refers to a C3 to C30 cycloalkyl group, a C3 to C30 cycloalkenyl group and a C3 to C30 cycloalkynyl group.

As used herein, the term "(meth)acrylate" refers to acrylate and/or methacrylate.

As used herein, the term "hydrophobic moiety" refers to a moiety that causes a given compound including the same to show agglomeration in an aqueous solution and to have a tendency of repelling water. For example, the hydrophobic moiety may include an aliphatic hydrocarbon group having a carbon number of greater than or equal to 2 (alkyl, alkenyl, alkynyl, etc.), an aromatic hydrocarbon group having a carbon number of greater than or equal to 6 (phenyl, naphthyl, aralkyl group, etc.), or an alicyclic hydrocarbon group of having a carbon number of greater than or equal to 5 (cyclohexyl, norbornene, etc.). The hydrophobic moiety substantially lacks an ability of making a hydrogen bond with an ambient medium and is not substantially mixed with the medium as its polarity is not matched with that of the medium.

As used herein, the term "group" refers to a group of Periodic Table.

As used herein, "Group II" refers to Group IIA and Group IIB, and examples of Group II metal may be Cd, Zn, Hg, and Mg, but are not limited thereto.

As used herein, "Group III" refers to Group IIIA and Group IIIB, and examples of Group III metal may be Al, In, Ga, and Tl, but are not limited thereto.

As used herein, "Group IV" refers to Group IVA and Group IVB, and examples of a Group IV metal may be Si, Ge, and Sn, but are not limited thereto. As used herein, the term "metal" may include a semi-metal such as Si. As used herein, "Group I" refers to Group IA and Group IB, and examples may include Li, Na, K, Ru, and Cs, but are not limited thereto.

As used herein, "Group V" refers to Group VA, and examples may include N, P, As, Sb, and Bi, but are not limited thereto.

As used herein, "Group VI" refers to Group VIA, and examples may include S, Se, and Te, but are not limited thereto.

As used herein, the term "visible light" refers to light having a wavelength of about 390 nm to about 700 nm. As used herein, the term "UV light" refers to light having a wavelength of greater than or equal to about 200 nm and and less than about 390 nm.

In an embodiment, a photosensitive composition includes
a plurality of quantum dots including an organic ligand on a surface thereof;
a binder;
a photopolymerizable monomer composition
a photoinitiator; and
a solvent.

Quantum dot has a theoretical quantum yield (QY) of about 100% and may emit light having a high color purity (e.g., FWHM of less than or equal to about 40 nm), so, without being bound to theory, it may accomplish the enhanced luminous efficiency and the improved color reproducibility. Accordingly, when using a color filter including a quantum dot polymer composite, it is expected to realize a display having an improved brightness, a wider viewing angle, and an improved color reproducibility. Therefore, it is desirable to develop techniques of patterning a quantum dot-polymer composite wherein a relatively large amount of quantum dots and, if desired, an inorganic light diffusing agent (which will be explained below) may be uniformly dispersed in the polymer matrix of the obtained pattern. However, the relatively large amount of quantum dots and the inorganic light diffusing agent may have limited compatibility with an organic material-based photosensitive composition (e.g., a photoresist). Without being bound by theory, as a photosensitive composition is patterned via exposure to light, the large amount of quantum dots and the light diffusing agent may interact with incident light for patterning, which in turn may cause difficulties in a patterning process so that a final photosensitive composition may not be formed with a desirable patterning property (e.g., breakpoint (BP) or critical dimension uniformity (CDUF)).

In an exemplary embodiment, (for use in a color filter), the quantum dot-containing photosensitive composition may include a large amount of quantum dots and a light diffusing agent. In an exemplary embodiment, for a red light emitting part, the combined amount of the red light emitting quantum dots and the light diffusing agent may be about 20 wt % or greater; for a green light emitting part, the combined amount of the green light emitting quantum dots and the light diffusing agent may be about 40% or greater. Without being bound by theory, when the combined amount of quantum dots and inorganic light diffusing agent exceeds about 20 wt % to enable a light emitting performance of quantum dot-contained photosensitive resin composition, a decreased amount of photo-curable components may cause a decrease in a developing rate and deterioration of a linearity of pattern after the development.

The photosensitive composition according to an embodiment includes a mixture of the main monomer and two types of auxiliary monomers (first accessory monomer and second accessory monomer) as a photopolymerizable monomer composition and thus may improve the developability and the linearity of the final composition even when the composition includes a large amount of quantum dots and/or an inorganic light diffusing agent.

Accordingly, in the photosensitive composition according to an embodiment, the mixture of the photopolymerizable monomer includes a main monomer having 1 to 6 carbon-carbon double bonds, a first accessory monomer having 8 to 20 carbon-carbon double bonds, and a second accessory monomer represented by Chemical Formula A:

$$R^1O\text{-}(L_1)_m\text{-}L_3\text{-}A\text{-}L_4\text{-}(L_2)_n\text{-}OR^2 \quad \text{Chemical Formula A}$$

wherein, A is a C1 to C40 aliphatic hydrocarbon group such as methylene, ethylene, propylene, and butylene, a C6 to C40 aromatic hydrocarbon group (e.g., arylene moiety) such as phenylene and naphthalene, —O— (ether group), or a moiety including two or more C6 to C40 aromatic hydrocarbon groups linked by a substituted or unsubstituted C1 to C10 alkylene, an ether, or a combination thereof such as biphenylene and bisphenyl alkylene. At least one methylene of the C1 to C40 aliphatic hydrocarbon group may be replaced by an ether group, an ester group, or a combination thereof.

$L_1$ and $L_2$ are independently the same or different, and a C2 to C5 substituted or unsubstituted oxyalkylene, for example, —O(CR$_2$)$_n$— or —(CR$_2$)$_n$O— (R is hydrogen or a methyl group, and n is 1 to 5).

m and n are each independently an integer of 0 to 20, provided that they are not simultaneously 0. In an embodiment, the sum of m and n may be 1 to 20.

$L_3$ and $L_4$ are the same or different, and are each independently a direct bond, O—(CH$_2$)n-CH(OH)—(CH$_2$)n- (n is an integer of 1 to 5), or —(CH$_2$)n-CH(OH)—(CH$_2$)n- (n is an integer of 1 to 5).

$R^1$ and $R^2$ are the same or different, and are each independently CR$_2$=CR— (wherein, R is hydrogen or a methyl group) or CR$_2$=CRCO— (wherein, R is hydrogen or a methyl group).

The main monomer having 1 to 6 carbon-carbon double bonds is a first component of a cured polymer of the quantum dot-polymer composite pattern, and is a type of monomer that may go through a light induced polymerization.

The type of the main monomer is not particularly limited, and may include, for example, alkyl(meth)acrylate, ethylene glycol di(meth)acrylate, triethylene glycol di(meth)acrylate, diethylene glycol di(meth)acrylate, 1,4-butanediol di(meth) acrylate, 1,6-hexanediol di(meth)acrylate, neopentylglycol di(meth)acrylate, pentaerythritol di(meth)acrylate, pentaerythritol tri(meth)acrylate, pentaerythritol tetra(meth) acrylate, dipentaerythritol di(meth)acrylate, dipentaerythritol tri(meth)acrylate, dipentaerythritol penta(meth)acrylate, dipentaerythritol hexa(meth)acrylate, trimethylolpropane tri (meth)acrylate, ethylene glycol monomethylether (meth) acrylate, novolac epoxy (meth)acrylate, diethylene glycol di(meth)acrylate, triethylene glycol di(meth)acrylate, propylene glycol di(meth)acrylate, tris(meth)acryloyloxyethyl phosphate, or a combination thereof, but it is not limited thereto.

The photosensitive composition includes a first accessory monomer and a second accessory monomer in addition to the main monomer. Without being bound by theory, the main monomer, the first accessory monomer, and the second accessory monomer may work together and thereby may secure developability and linearity of a pattern even in the presence of quantum dots and an inorganic light diffusing agent.

The first accessory monomer may have at least 8, for example, at least 10, or at least 12 carbon-carbon double bonds. The number of carbon-carbon double bonds of the first accessory monomer may be less than or equal to about 20. Without being bound by any theory, the introduction of the first accessory monomer increases the number of cross-linkable functional groups, and these functional groups may participate in a cross-linking reaction, thereby the composite may have greater density and thus the linearity of the resulting pattern may be improved.

The first accessory monomer may include a hyperbranched acrylate-based monomer. The hyperbranched monomer may have a regularly branched shape like the shape of a dendrimer. In an embodiment, the hyperbranched monomer may have an incompletely branched or irregular structure. The first accessory monomer may further include at least one (for example, one to four) hydroxy groups, and the density and the developability of the patterned composite may be improved together. The second monomer may be used alone or in a mixture of at least two compounds.

A weight average molecular weight of the first accessory monomer may be greater than or equal to about 300 grams per mole (g/mol), for example, from about 500 g/mol to about 800 g/mol.

The first accessory monomer may be synthesized by a known method or is commercially available (e.g., from Nippon Kayaku Co., Ltd.).

The second accessory monomer may be represented by Chemical Formula A. For example, the second accessory monomer may be represented by one of Chemical Formula A-1 and Chemical Formula A-2:

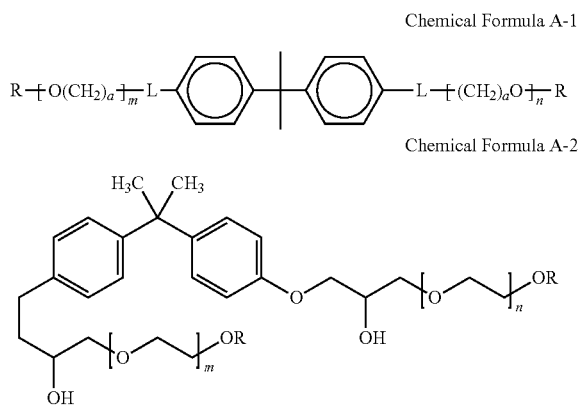

wherein, R is the same or different, and are each independently —COCR═CR$_2$ (R is hydrogen or a methyl group), a is an integer of 1 to 5, m and n are the same as defined in Chemical Formula A, and L is the same or different, and is independently a direct bond, C1 to C10 alkylene, or an ether (—O—).

In an exemplary embodiment, the second accessory monomer may be bisphenol A di(meth)acrylate, bisphenol A epoxy (meth)acrylate, bisphenol A ethylene glycol di(meth) acrylate, bisphenol A ethoxylate di(meth)acrylate, poly(ethylene glycol) reacted with bisphenol A glycidyl ether, or a combination thereof A weight average molecular weight of the second accessory monomer may be greater than or equal to about 500 g/mol, for example, from about 700 g/mol to about 1500 g/mol.

In the photopolymerizable monomer composition, an amount of the main monomer may be greater than or equal to about 60 wt %, for example, greater than or equal to about 65 wt % based on the total weight of the photopolymerizable monomer mixture. An amount of the main monomer may be less than or equal to about 90 wt %, for example, less than or equal to about 85 wt % based on the total weight of the photopolymerizable monomer composition.

In the photopolymerizable monomer composition, the sum of the first accessory monomer and the second accessory monomer may be greater than or equal to about 10 wt %, for example, greater than or equal to about 15 wt % based on the total weight of the photopolymerizable monomer composition. In the photopolymerizable monomer composition, the sum of the first accessory monomer and the second accessory monomer may be less than or equal to about 40 wt %, for example, less than or equal to 35 wt % based on the total weight of the photopolymerizable monomer composition.

In the photopolymerizable monomer composition, an amount of the first accessory monomer is the same or greater than that of the second accessory monomer. For example, an amount of the second accessory monomer may be less than or equal to about 100 parts by weight, for example, from about 0.01 parts by weight (or about 0.1 parts by weight or about 1 part by weight) to about 100 parts by weight based on 100 parts by weight of the first accessory monomer.

In an exemplary embodiment, when the photopolymerizable monomer composition has the aforementioned composition, the resulting photosensitive composition may exhibit an improved level of breakpoint (BP) and critical dimension uniformity (CDUF). Accordingly, the photosensitive composition may have a breakpoint time of less than or equal to about 60 seconds, for example, less than about 60 seconds, less than or equal to about 50 seconds, or less than or equal to about 40 seconds, wherein the breakpoint time is a time for showing a pattern when the photosensitive composition is exposed under the pattern and developed. The photosensitive composition may have a critical dimension uniformity (CDUF) of less than or equal to about 5%, for example, less than or equal to about 4%, or less than or equal to about 3%.

As used herein, the term 'breakpoint (BP)' refers to a time how long it takes a photosensitive composition to form a pattern noticeable by naked eye in a certain area from the center of the substrate after a coated film of the composition is exposed to UV light and a developing solution is sprayed onto the exposed region. Herein, the term, "Critical Dimension Uniformity (CDUF)" refers to an error range for a width of pattern having a predetermined resolution. The CDUF may be an index for evaluating the linearity of pattern and may be obtained by the following Equation (referring to FIG. 1):

$$CDUF=[(CD_{max}-CD_{min})/(CD_{max}+CD_{min})]\times 100(\%)$$

In the photosensitive composition, an amount of the photopolymerizable monomer composition may be greater than or equal to about 1 wt %, for example about 5 wt %, based on the total amount of the composition, but it is not limited thereto. In the photosensitive composition, an amount of the photopolymerizable monomer composition may be less than or equal to about 25 wt %, for example less than or equal to about 20 wt % based on the total amount of the composition, but it is not limited thereto.

In a photosensitive composition according to an embodiment, the quantum dot (i.e., a semiconductor nanocrystal) is not particularly limited and may be a commercially available quantum dot. For example, the quantum dot may be a Group II-VI compound, a Group III-V compound, a Group IV-VI compound, a Group IV compound, a Group compound, or a combination thereof.

The Group II-VI compound may be selected from a binary element compound selected from CdSe, CdTe, ZnS, ZnSe, ZnTe, ZnO, HgS, HgSe, HgTe, MgSe, MgS, and a mixture thereof; a ternary element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. The Group III-V compound may be selected from a binary element compound selected from GaN, GaP, GaAs, GaSb, AlN, AlP, AlAs, AlSb, InN, InP, InAs, InSb, and a mixture thereof; a ternary element compound selected from GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof; and a quaternary element compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group IV-VI compound may be selected from a binary element compound selected from SnS, SnSe, SnTe, PbS, PbSe, PbTe, and a mixture thereof; a ternary element compound selected from SnSeS, SnSeTe, SnSTe, PbSeS, PbSeTe, PbSTe, SnPbS, SnPbSe, SnPbTe, and a mixture thereof; and a quaternary element compound selected from SnPbSSe, SnPbSeTe, SnPbSTe, and a mixture thereof. The Group compound may include $CuInSe_2$, $CuInS_2$, CuInGaSe, and CuInGaS but is not limited thereto. The Group VI compound may include CuZnSnSe, and CuZnSnS but is not limited thereto. The Group IV compound may include a single-element compound selected from Si, Ge, and a mixture thereof; and a binary element compound selected from SiC, SiGe, and a mixture thereof.

The binary element compound, the ternary element compound, or the quaternary element compound, respectively, exist in a uniform concentration in the particle or partially different concentrations in the same particle. In addition, the semiconductor nanocrystal particle may have a core-shell structure wherein a first semiconductor nanocrystal is surrounded by a second semiconductor nanocrystal different from the first semiconductor nanocrystal. The Interface between the core and the shell may have a concentration gradient wherein the concentration of an element of the shell decreases toward the core. In addition, the semiconductor nanocrystal particle may have a semiconductor nanocrystal core and a multi-layered shell surrounding the semiconductor nanocrystal core. The core and multi-shell structure has at least two shells wherein each shell may be a single composition, an alloy, or have a concentration gradient.

In the semiconductor nanocrystal particle, the materials of the shell may have a larger energy bandgap than that of the core, and thereby the semiconductor nanocrystal may exhibit a quantum confinement effect more effectively. In the case of a multi-layered shell type of semiconductor nanocrystal particle, the bandgap of the material of an outer layer of the shell may be higher energy than that of the material of an inner layer of the shell (i.e., a layer that is closer to the core). In this case, the semiconductor nanocrystal particle may emit light of a UV to infrared wavelength range.

The semiconductor nanocrystal may have a quantum yield of greater than or equal to about 10%, greater than or equal to about 30%, for example, greater than or equal to about 50%, greater than or equal to about 60%, greater than or equal to about 70%, or greater than or equal to about 90%.

For use in display devices, the semiconductor nanocrystal may have a narrower FWHM so as to realize enhanced color purity or color reproducibility. The semiconductor nanocrystal may have a FWHM of less than or equal to about 45 nm, for example less than or equal to about 40 nm, or less than or equal to about 30 nm. Within such ranges, a device including the nanocrystal may have enhanced color purity or improved color reproducibility.

The quantum dot (i.e., the semiconductor nanocrystal particle) may have a particle diameter (i.e., the longest diameter for a non-spherical shape particle) of about 1 nm to about 100 nm. In an exemplary embodiment, the quantum dot may have a particle diameter of about 1 nm to about 20 nm, for example, from about 2 nm (or from about 3 nm) to about 15 nm.

The shape of the quantum dot is not particularly limited. In an exemplary embodiment, the quantum dot may have spherical, pyramidal, multi-armed, or cubic nanoparticles, nanotubes, nanowires, nanofibers, nanoplate particles, or the like.

The quantum dot is commercially available or may be synthesized in any suitable method. For example, several nano-sized quantum dots may be synthesized according to a wet chemical process. In the wet chemical process, precursors react in an organic solvent to grow nanocrystal particles, and the organic solvent or a ligand compound may coordinate the surface of the semiconductor nanocrystal, controlling the growth of the nanocrystal. Examples of the organic solvent and ligand compound are known. The organic solvent coordinated on the surface of the quantum dot may affect stability of a device, and thus excess organic materials that are not coordinated on the surface of the quantum dot may be removed by pouring it in excessive non-solvent, and centrifuging the resulting mixture. Examples of the non-solvent may be acetone, ethanol, methanol, and the like, but are not limited thereto. After the removal of extra organic materials, the amount of the organic materials coordinated on the surface of the quantum dot may be less than or equal to about 50 wt %, for example, less than or equal to about 30 wt %, less than or equal to about 20 wt %, or less than or equal to about 10 wt % based on the total weight of the quantum dot. The organic material may include a ligand compound, an organic solvent, or a combination thereof.

The quantum dot may have an organic ligand bound to a surface thereof. The organic ligand may have a hydrophobic moiety. In an embodiment, the organic ligand having a hydrophobic moiety may include RCOOH, $RNH_2$, $R_2NH$, $R_3N$, RSH, $R_3PO$, $R_3P$, ROH, RCOOR', $RPO(OH)_2$, $R_2POOH$ (wherein, R and R' are independently a C5 to C24 alkyl group, a C5 to C24 alkenyl group, or a C5 to C20 aryl group), a polymeric organic ligand, or a combination thereof.

Examples of the organic ligand compound on the surface of the quantum dot may include thiol compounds such as methane thiol, ethane thiol, propane thiol, butane thiol, pentane thiol, hexane thiol, octane thiol, dodecane thiol, hexadecane thiol, octadecane thiol, or benzyl thiol; amines such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropyl amine, tributylamine, or trioctylamine; carboxylic acid compounds such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; phosphine compounds such as methyl phosphine, ethyl phosphine, propyl phosphine, butyl phosphine, pentyl phosphine, octylphosphine, dioctyl phosphine, tributylphosphine, or trioctylphosphine; phosphine compounds or oxide compounds thereof such as methyl phosphine oxide, ethyl phosphine oxide, propyl phosphine oxide, butyl phosphine oxide, pentyl phosphine oxide, tributyl phosphine oxide, octyl phosphine oxide, dioctyl phosphine oxide, or trioctyl phosphine oxide; diphenyl phosphine, tri phenyl phosphine compound or oxide compounds thereof; C5 to C20 alkyl C5 to C20 alkyl phosphonic acid such as hexylphosphinic acid, octylphosphinic acid, dodecanephosphinic acid, tetradecanephosphinic acid, hexadecanephosphinic acid, or octadecanephosphinic acid; and the like, but are not limited thereto. The quantum dot may include the hydrophobic organic ligand at alone or as a mixture of two or more.

In an exemplary embodiment, an amount of the quantum dots including the organic ligand may be greater than or equal to about 1 wt %, for example, greater than or equal to about 5 wt %, or greater than or equal to about 10 wt %, based on the total amount of the composition. In an exemplary embodiment, the amount of the quantum dots including the organic ligand may be less than or equal to about 40 wt %, for example, less than or equal to about 35 wt % based on the total amount of the composition.

In the composition according to an embodiment, an amount (e.g., greater than or equal to about 20% or about 40% based on the total weight of composition) of quantum dots (and selectively, inorganic light diffusing agent) may be dispersed in the polymer composite. As a method of forming a pattern including quantum dots in conventional arts, U.S. Pat. No. 7,199,393 discloses that quantum dots having a photosensitive functional group on the surface are used in the patterning method, the entire content of which is incorporated herein by reference. In this method, a photosensitive functional group is introduced onto the surface of the quantum dot and then is subjected to a photopolymerization, if desired together with a photopolymerizable monomer, to provide a quantum dot-polymer composite pattern. This method may require an additional process of a surface treatment of quantum dots and the developing process using an organic solvent to form a pattern.

In an exemplary embodiment, in order to provide an alkali-developable quantum dot-polymer composite pattern, when quantum dots (e.g., in which organic ligand is bound to the surface) are mixed with the alkali-developable photoresist without performing the surface treatment, the quantum dots may have insufficient compatibility with the photoresist, so the quantum dots are not dispersed and agglomerated. In an exemplary embodiment, for the application of the patterned quantum dot-polymer composite in a color filter, a large amount of quantum dots may be included in the composite, but in order to form a pattern thereof, the quantum dots may have to be uniformly dispersed.

In the case of photosensitive composition according to an embodiment, quantum dots including an organic ligand (e.g., having a hydrophobic moiety) on the surface is preliminarily dispersed in the COOH-group-containing binder solution including a hydrophobic moiety, and then the obtained quantum dot-binder dispersion is mixed with the other components for a photoresist, so the quantum dots may be well dispersed in the alkali-developable photoresist. Therefore, in case of the photosensitive composition according to an embodiment, a relatively large amount of the quantum dots may be dispersed in the photoresist composition. Without wishing to be bound by any theory, when quantum dots are dispersed in a COOH group-containing binder solution having a hydrophobic moiety, the quantum dots may form a dispersion due to the presence of the binder and the quantum dots dispersed by the binder may maintain their dispersed state even when they are in the photoresist composition.

The photosensitive composition according to an embodiment further includes a carboxyl group-containing binder, wherein the carboxyl group-containing binder is a copolymer of the monomer mixture including the first monomer having a carboxyl group and a carbon-carbon double bond and the second monomer having a carbon-carbon double bond and a hydrophobic moiety but including no carboxyl group; the plurality of quantum dots are dispersed (e.g., separated to each other) by the carboxyl binder. The plurality of quantum dots may be dispersed (for example, separated from one another) by the carboxylic acid group (—COOH)-containing polymer to form a quantum dot dispersion. The quantum dot dispersion includes the carboxylic acid group (—COOH)-containing polymer and the plurality of quantum dots dispersed in the carboxylic acid group (—COOH)-containing polymer. The quantum dot dispersion may further include a solvent.

As the photosensitive composition according to an embodiment may provide a quantum dot-polymer composite pattern by using a quantum dot with no photo-polymerizable functional group (e.g., carbon-carbon double bond such as (meth)acrylate) on a surface thereof, a surface treatment process for the quantum dot may be omitted, and the use of the organic solvent in the developing process is not necessary.

Examples of the first monomer may include, but are not limited to, acrylic acid, methacrylic acid, maleic acid, itaconic acid, fumaric acid, 3-butanoic acid, carbonic acid vinyl ester compounds such as vinyl acetate, and vinyl benzoate. The first monomer may be one or more compounds.

Examples of the second monomer may include, but are not limited to, alkenyl aromatic compounds such as styrene, α-methyl styrene, vinyl toluene, or vinyl benzyl methyl ether; unsaturated carbonic acid ester compounds such as methyl acrylate, methyl methacrylate, ethyl acrylate, ethyl methacrylate, butyl acrylate, butyl methacrylate, benzyl acrylate, benzyl methacrylate, cyclohexyl acrylate, cyclohexyl methacrylate, phenyl acrylate, or phenyl methacrylate; unsaturated carbonic acid amino alkyl ester compounds such as 2-amino ethyl acrylate, 2-amino ethyl methacrylate, 2-dimethyl amino ethyl acrylate, N-phenylmaleimide, N-benzylmaleimide, N-alkylmaleimide, or 2-dimethyl amino ethyl methacrylate; unsaturated carbonic acid glycidyl ester compounds such as glycidyl acrylate, or glycidyl methacrylate; vinyl cyanide compounds such as acrylonitrile, or methacrylonitrile; and unsaturated amide compounds such as acrylamide and methacrylamide, but are not limited thereto. As the second monomer, at least one compound may be used.

The carboxyl group-containing binder may have an acid value of greater than or equal to about 50 milligrams KOH per gram (mg KOH/g) in order to disperse a quantum dot, but the acid value may vary with a chemical structure (e.g., a chemical structure of a main chain or a hydrophobic moiety at the side chain) of the binder. For example, the carboxyl group-containing binder may have an acid value of greater than or equal to about 60 mg KOH/g, greater than or equal to about 70 mg KOH/g, greater than or equal to about 80 mg KOH/g, greater than or equal to about 90 mg KOH/g, greater than or equal to about 100 mg KOH/g, or greater than or equal to about 110 mg KOH/g. The carboxyl group-containing binder may have an acid value of, for example, less than or equal to about 200 mg KOH/g, for example, less than or equal to about 190 mg KOH/g, less than or equal to about 180 mg KOH/g, or less than or equal to about 160 mg KOH/g, but it is not limited thereto. The quantum dots are mixed with a solution of a binder having the acid value within the aforementioned ranges to provide a quantum dot-binder dispersion; the obtained quantum dot-binder dispersion may have the improved compatibility with the other components for the photoresist (e.g., photopolymerizable monomer, photoinitiator, solvent, etc.) and thereby the quantum dots may be dispersed in the final composition (i.e., photoresist composition) to form a pattern. In an embodiment, the carboxyl group-containing binder may have an acid value of about 100 mg KOH/g to about 200 mg KOH/g.

The carboxyl group-containing binder may be a copolymer of a monomer mixture that further includes a third monomer having a carbon-carbon double bond and a hydrophilic moiety and not having a carboxyl group.

Examples of the third monomer may include 2-hydroxy ethyl acrylate, 2-hydroxy ethyl methacrylate, 2-hydroxy butyl acrylate, 2-hydroxy butyl (meth)acrylate, 2-amino ethyl acrylate, and 2-amino ethyl (meth)acrylate, but are not limited thereto. The third monomer may be one or more compounds.

In an embodiment, the carboxyl group-containing binder may be a copolymer of (meth)acrylic acid and at least one second monomer selected from arylalkyl(meth)acrylate, hydroxyalkyl (meth)acrylate, and styrene.

In an exemplary embodiment, in the carboxyl group-containing binder, an amount of the first repeating unit derived from the first monomer may be greater than or equal to about 10 mole percent (mol %), for example, greater than or equal to about 15 mol %, greater than or equal to about 25 mol %, or greater than or equal to about 35 mol %. In the carboxyl group-containing binder, an amount of the first repeating unit may be less than or equal to about 90 mol %, for example, less than or equal to about 89 mol %, less than or equal to about 88 mol %, less than or equal to about 87 mol %, less than or equal to about 86 mol %, less than or equal to about 85 mol %, less than or equal to about 80 mol %, less than or equal to about 70 mol %, less than or equal to about 65 mol %, less than or equal to about 45 mol %, less than or equal to about 35 mol %, or less than or equal to about 25 mol %.

In an exemplary embodiment, in the carboxyl group-containing binder, an amount of the second repeating unit derived from the second monomer may be greater than or equal to about 10 mol %, for example, may be greater than or equal to about 15 mol %, may be greater than or equal to about 25 mol %, or may be greater than or equal to about 35 mol %. In the carboxyl group-containing binder, an amount of the second repeating unit may be less than or equal to about 90 mol %, for example, less than or equal to about 89 mol %, less than or equal to about 88 mol %, less than or equal to about 87 mol %, less than or equal to about 86 mol %, less than or equal to about 85 mol %, less than or equal to about 80 mol %, less than or equal to about 70 mol %, less than or equal to about 65 mol %, less than or equal to about 40 mol %, less than or equal to about 35 mol %, or less than or equal to about 25 mol %.

In an exemplary embodiment, in the carboxyl group-containing binder, an amount of the third repeating unit derived from the third monomer may be greater than or equal to about 1 mol %, for example, greater than or equal to about 5 mol %, greater than or equal to about 10 mol %, or greater than or equal to about 15 mol %. In the carboxyl group-containing binder, an amount of the third repeating unit may be less than or equal to about 20 mol %, for example, less than or equal to about 15 mol %, or less than or equal to about 10 mol %.

For example, the carboxyl group-containing binder may include a methacrylic acid/methyl methacrylate copolymer, a methacrylic acid/benzyl methacrylate copolymer, methacrylic acid/benzyl methacrylate/styrene copolymer, a methacrylic acid/benzyl methacrylate/2-hydroxy ethyl methacrylate copolymer, or a methacrylic acid/benzyl methacrylate/styrene/2-hydroxy ethyl methacrylate copolymer.

The carboxyl group-containing binder may have a molecular weight of greater than or equal to about 1000 g/mol, for example, greater than or equal to about 2000 g/mol, greater than or equal to about 3000 g/mol, or greater than or equal to about 5000 g/mol. The carboxyl group-containing binder may have a molecular weight of less than or equal to about 100,000 g/mol, for example, less than or equal to about 50,000 g/mol. Within the foregoing ranges, more improved developability may be realized.

In an exemplary embodiment, in the photosensitive composition, an amount of the carboxyl group-containing binder may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt % based on the total weight of the composition. An amount of the carboxyl group-containing binder may be less than or equal to about 40 wt %, for example, less than or equal to about 30 wt % based on the total weight of the composition. In an embodiment, an amount of the carboxyl group-containing binder may be 5 to 40 wt % based on the total weight of solids (i.e., non-volatiles) of the composition. Within the aforementioned range, appropriate developability and improved processibility may be accomplished in a subsequent pattern forming process while ensuring dispersibility of quantum dot.

A photosensitive composition according to an embodiment includes a reactive compound having at least two thiol groups.

The reactive compound may have a structure of Chemical Formula 1:

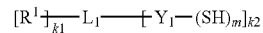

wherein, in Chemical Formula 1, $R^1$ is selected from hydrogen; a substituted or unsubstituted C1 to C30 linear or branched alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a C1 to C10 alkoxy group; a hydroxy group; —$NH_2$; a substituted or unsubstituted C1 to C30 amine group (—NRR', wherein R and R' are independently hydrogen or a C1 to C30 linear or branched alkyl group); an isocyanate group; a halogen; —ROR' (wherein R is a substituted or unsubstituted C1 to C20 alkylene group and R' is hydrogen or a C1 to C20 linear or branched alkyl group); acyl halide (—RC(=O)X, wherein R is a substituted or unsubstituted alkylene group and X is a halogen); —C(=O)OR' (wherein R' is hydrogen or a C1 to C20 linear or branched alkyl group); —CN; —C(=O)ONRR' (wherein R and R' are independently hydrogen or a C1 to C20 linear or branched alkyl group), or a combination thereof, $L_1$ is a carbon atom, a substituted or unsubstituted C1 to C30 alkylene group, a substituted or unsubstituted C6 to C30 cycloalkylene group, a substituted or unsubstituted C6 to C30 arylene group, or a substituted or unsubstituted C6 to C30 heteroarylene group, wherein at least one methylene (—$CH_2$—) of the substituted 01 to C30 alkylene group may be replaced by sulfonyl (—$SO_2$—), carbonyl (CO), ether (—O—), sulfide (—S—), sulfoxide (—SO—), ester (—C(=O)O—), amide (—C(=O)NR—) (wherein R is hydrogen or C1 to C10 alkyl group), or a combination thereof, $Y_1$ is a single bond; a substituted or unsubstituted C1 to C30 alkylene group; a substituted or unsubstituted C2 to C30 alkenylene group; or a C1 to C30 alkylene group or a C2 to C30 alkenylene group wherein at least one methylene (—CH$_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, m is an integer of 1 or more, k1 is 0 or an integer of 1 or more, k2 is an integer of 1 or more, and the sum of m and k2 is an integer of 3 or more, provided that m does not exceed the valence of Y$_1$ when Y$_1$ is not a single bond and provided that the sum of k1 and k2 does not exceed the valence of L$_1$.

The reactive compound may include a compound of Chemical Formula 1-1:

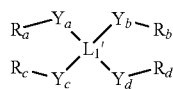

Chemical Formula 1-1 wherein, in Chemical Formula 1-1, L$_1$' is carbon, a substituted or unsubstituted C2 to C20 alkylene group, a substituted or unsubstituted C6 to C30 arylene group; a substituted or unsubstituted C3 to C30 heteroarylene group; a substituted or unsubstituted C3 to C30 cycloalkylene group; or a substituted or unsubstituted C3 to C30 heterocycloalkylene group, Y$_a$ to Y$_d$ are independently, a direct bond; a substituted or unsubstituted C1 to C30 alkylene group; a substituted or unsubstituted C2 to C30 alkenylene group; or a C1 to C30 alkylene group or a C2 to C30 alkenylene group wherein at least one methylene (—CH$_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, and R$_a$ to R$_d$ is R$^1$ or SH of Chemical Formula 1, provided that at least two of R$_a$ to R$_d$ are SH.

The reactive compound may prevent the luminous efficiency from deteriorating by the heat treatment (e.g., post-baking), which is accompanied by the photoresist process of quantum dots dispersed in the pattern obtained by further reacting with a photopolymerizable monomer described later, while not making unfavorable influences on the dispersion of quantum dots. Without being bound to specific theory, it is considered that the reactive compound makes the patterning polymer form a denser network by further reacting with the photopolymerizable monomer described later. In addition, the reactive compound may provide a bond between QD and the photopolymerizable monomer to ensure the dispersion and the stability. The pattern formed from the photosensitive composition including reactive compound may have improved light emitting characteristics (e.g., characteristics of maintaining the blue-light conversion rate), for example, in greater than or equal to about 2 times greater than the case of including no reactive compound. According to an embodiment, the photosensitive composition may maintain a blue light conversion rate of greater than or equal to about 40% of the initial value when it is developed by an alkali aqueous solution and then dried and heated at about 180° C. for about 30 minutes.

The reactive compound may include a dithiol compound, a trithiol compound, a tetrathiol compound, or a combination thereof. For example, the reactive compound may include glycol di-3-mercaptopropionate, glycol dimercaptoacetate, trimethylolpropane tris(3-mercaptopropionate), pentaerythritol tetrakis(3-mercaptopropionate), pentaerythritol tetrakis(2-mercaptoacetate), 1,6-hexanedithiol, 1,3-propanedithiol, 1,2-ethanedithiol, polyethylene glycol dithiol including 1 to 10 ethylene glycol repeating units, or a combination thereof. In the photosensitive composition, an amount of the reactive compound may be greater than or equal to about 0.1 wt %, for example, greater than or equal to about 0.5 wt %, or greater than or equal to about 1 wt % based on the total weight of the composition. The amount of the reactive compound may be less than or equal to about 10 wt %, for example, less than or equal to about 5 wt % based on the total weight of the composition.

In an exemplary embodiment, the photosensitive composition includes a photopolymerization initiator. Any type of suitable photopolymerizable initiator may be selected appropriately. For example, the available photopolymerization initiator may include a triazine compound, an acetophenone compound, a benzophenone compound, a thioxanthone compound, a benzoin compound, an oxime compound, or a combination thereof, but it is not limited thereto.

Examples of the triazine compound may include 2,4,6-trichloro-s-triazine, 2-phenyl-4,6-bis(trichloro methyl)-s-triazine, 2-(3',4'-dimethoxy styryl)-4,6-bis(trichloro methyl)-s-triazine, 2-(4'-methoxy naphthyl)-4,6-bis(trichloro methyl)-s-triazine, 2-(p-methoxy phenyl)-4,6-bis(trichloro methyl)-s-triazine, 2-(p-tolyl)-4,6-bis(trichloro methyl)-s-triazine, 2-biphenyl-4,6-bis(trichloro methyl)-s-triazine, bis(trichloro methyl)-6-styryl-s-triazine, 2-(naphthyl 1-yl)-4,6-bis(trichloro methyl)-s-triazine, 2-(4-methoxynaphthol 1-yl)-4,6-bis(trichloro methyl)-s-triazine, 2,4-trichloro methyl(piperonyl)-6-triazine, and 2,4-(trichloro methyl (4'-methoxy styryl)-6-triazine, and the like, but are not limited thereto.

Examples of the acetophenone compound may be 2,2'-diethoxy acetophenone, 2,2'-dibutoxy acetophenone, 2-hydroxy-2-methyl propinophenone, p-t-butyl trichloro acetophenone, p-t-butyl dichloro acetophenone, 4-chloro acetophenone, 2,2'-dichloro-4-phenoxy acetophenone, 2-methyl-1-(4-(methylthio)phenyl)-2-morpholino propan-1-one, 2-benzyl-2-dimethyl amino-1-(4-morpholino phenyl)-butan-1-one, and the like, but are not limited thereto.

Examples of the benzophenone compound may be benzophenone, benzoyl benzoate, benzoyl methyl benzoate, 4-phenyl benzophenone, hydroxy benzophenone, acrylated benzophenone, 4,4'-bis(dimethyl amino)benzophenone, 4,4'-dichloro benzophenone, 3,3'-dimethyl-2-methoxy benzophenone, and the like, but are not limited thereto.

Examples of the thioxanthone compound may be thioxanthone, 2-methyl thioxanthone, isopropyl thioxanthone, 2,4-diethyl thioxanthone, 2,4-diisopropyl thioxanthone, 2-chloro thioxanthone, and the like, but are not limited thereto.

Examples of the benzoin compound may be benzoin, benzoin methyl ether, benzoin ethyl ether, benzoin isopropyl ether, benzoin isobutyl ether, benzyl dimethyl ketal, and the like, but are not limited thereto.

Examples of the oxime compound may be 2-(o-benzoyloxime)-1-[4-(phenylthio)phenyl]-1,2-octandione and 1-(o-acetyloxime)-1-[9-ethyl-6-(2-methylbenzoyl)-9H-carbazol-3-yl]ethanone, and the like, but are not limited thereto.

In an exemplary embodiment, the photopolymerization initiator may be a carbazole compound, a diketone compound, a sulfonium borate compound, a diazo compound, a biimidazole compound, and the like, but are not limited thereto.

In an exemplary embodiment, in the photosensitive composition, an amount of the photoinitiator may be greater than or equal to about 0.01 wt %, for example, greater than or equal to about 0.1 wt %, or greater than or equal to about 1 wt %, based on the total weight of the composition. The amount of the photoinitiator may be less than or equal to about 10 wt %, for example, less than or equal to about 5 wt %, based on the total weight of the composition. In an embodiment, the amount of the photoinitiator may be about 0.05 wt % to about 10 wt % based on the total weight of solids (i.e., non-volatiles) of the composition. Within the aforementioned ranges, a desirable pattern may be formed.

In an exemplary embodiment, the photosensitive composition may further include one or more additives such as a light diffusing agent, a leveling agent, or a coupling agent in addition to the aforementioned components. The amount of the additive is not particularly limited and may be controlled within an appropriate range wherein the additive does not make an adverse effect on the photosensitive composition and the pattern obtained therefrom.

The light diffusing agent may increase a refractive index of composition in order to increase a chance of the incident light to meet with quantum dots. The light diffusing agent may include inorganic oxide particles such as alumina, silica, zirconia, titanium oxide particulates, or zinc oxide, and metal particles such as gold, silver, copper, or platinum, but is not limited thereto.

The leveling agent is aimed to prevent stains or spots and to improve planarization and leveling characteristics of a film, and examples may include the following but are not limited thereto.

A fluorine leveling agent may include commercial products, for example BM-1000®, and BM-1100® (BM Chemie Inc.); MEGAFACE F 142D®, F 172®, F 173®, and F 183® of Dainippon Ink Kagaku Kogyo Co., Ltd.; FC-135®, FC-170C®, FC-430®, and FC-431® of Sumitomo 3M Co., Ltd.; SURFLON S-112®, SURFLON S-113®, SURFLON S-131®, SURFLON S-141®, and SURFLON S-145® of Asahi Glass Co., Ltd.); and SH-28PA®, SH-190®, SH-193®, SZ-6032®, and SF-8428®, and the like of Toray Silicone Co., Ltd.).

Types and amounts of the additives may be adjusted if necessary.

The coupling agent is selected to increase adherence with a pattern and glass and resolution, and examples thereof may include a silane coupling agent. Examples of the silane coupling agent may be vinyl trimethoxysilane, vinyl tris (2-methoxyethoxysilane), 3-glycidoxypropyl trimethoxysilane, 2-(3,4-epoxy cyclohexyl)ethyl trimethoxysilane, 3-chloropropyl methyldimethoxysilane, 3-chloropropyl trimethoxysilane, 3-methacryloxylpropyl trimethoxysilane, 3-mercaptopropyl trimethoxysilane, and the like, but are not limited thereto.

The photosensitive composition includes a solvent. An amount of the solvent may be determined considering the amounts of the above components (i.e., the organic ligand-containing quantum dot, COOH group-containing binder, the photopolymerizable monomer mixture, and the photoinitiator), and additives. The composition may include the solvent in an amount that the remaining amount of the composition other than the amounts of the solid (i.e., non-volatiles) components is the amount of the solvent. The solvent may be selected appropriately considering its affinity for other components (e.g., the binder, the photopolymerizable monomer, the photoinitiator, and other additives), its affinity for alkali developing solution, and its boiling point. Examples of the solvent may be ethylene glycols such as ethyl 3-ethoxy propionate, ethylene glycol, diethylene glycol, or polyethylene glycol; glycol ethers such as ethylene glycol monomethyl ether, ethylene glycol monoethylether, diethylene glycol monomethyl ether, ethylene glycol diethylether, or diethylene glycol dimethylether; glycol ether acetates such as ethylene glycol acetate, ethylene glycol monoethylether acetate, diethylene glycol monoethylether acetate, or diethylene glycol monobutylether acetate; propylene glycols such as propylene glycol; propylene glycol ethers such as propylene glycol monomethylether, propylene glycol monoethylether, propylene glycol monopropyl ether, propylene monobutylether, propylene glycol dimethylether, dipropylene glycol dimethylether, propylene glycol diethylether, or dipropylene glycol diethylether; propylene glycol ether acetates such as propylene glycol monomethyl ether acetate, or dipropylene glycol monoethylether acetate; amides such as N-methyl pyrrolidone, dimethyl formamide, or dimethyl acetamide; ketones such as methylethylketone (MEK), methylisobutylketone (MIBK), or cyclohexanone; petroleums such as toluene, xylene, or solvent naphtha; esters such as ethyl acetate, butyl acetate, or ethyl lactate; ethers such as diethyl ether, dipropyl ether, or dibutyl ether, and a mixture thereof.

A method of preparing a photosensitive composition according to an embodiment includes preparing a binder solution including the binder and the solvent;

dispersing the plurality of quantum dots including organic ligands on the surface thereof in the binder solution to obtain a quantum dot-binder dispersion;

mixing the quantum dot-binder dispersion with at least one of the reactive compound; the photoinitiator; the mixture of the photopolymerizable monomer; and the solvent.

A mixing manner is not particularly limited and may be selected appropriately. For example, each component may be mixed sequentially or simultaneously.

The preparing method may further include selecting a quantum dot including an organic ligand on the surface, and selecting a binder capable of dispersing the quantum dot (e.g., a carboxyl binder). In the step of selecting the binder, the binder may be a carboxyl binder, the carboxyl binder may be a copolymer of the monomer mixture including the first monomer having a carboxyl group and a carbon-carbon double bond and the second monomer having a carbon-carbon double bond and a hydrophobic moiety and not having a carboxyl group, and chemical structure and acid values of the copolymer may be considered.

Details of the quantum dot, the carboxyl binder, the photopolymerizable monomer, and the photoinitiator are the same as set forth above.

The photosensitive composition may be developed with an alkaline aqueous solution, and thus when the photosensitive composition is used, a quantum dot-polymer composite pattern may be patterned without using an organic solvent developing solution.

Figure 2:
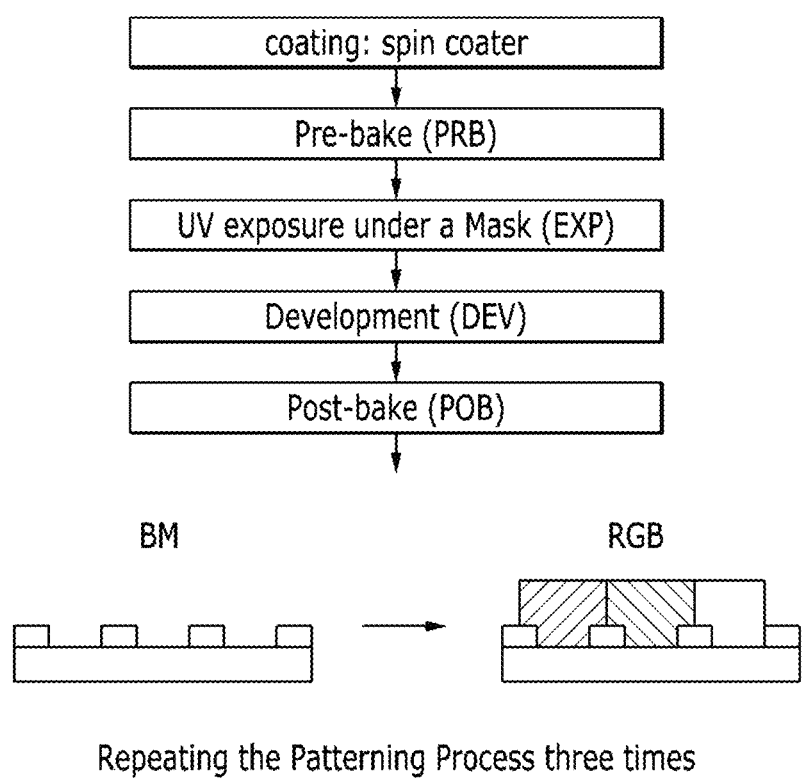
FIG. 2 is a sequence of steps for a forming process according to an embodiment.

A non-limiting method of forming a pattern is explained referring to FIG. 2.

The photosensitive composition is coated on a predetermined substrate (e.g., a glass substrate or a glass substrate coated with a predetermined thickness of SiNx (protective layer) (e.g., about 500 to about 1500 Å of the protective layer)) in an appropriate manner such as a spin coating, a slit coating and the like to form a film of a predetermined thickness (e.g., thickness of about 3 micrometers (μm) to about 30 μm). The formed film may be pre-baked, if desired. The specific conditions of pre-baking such as a temperature, a time, and an atmosphere are known in the art and may be selected appropriately.

The formed (or, optionally pre-baked) film is exposed to light of a predetermined wavelength under a mask having a predetermined pattern. The wavelength and the intensity of light may be selected considering the types and the amounts of photoinitiator, and the types and the amounts of quantum dot or the like.

The exposed film is treated with an alkali developing solution, and thereby the unexposed region in the film is dissolved to provide a desirable pattern. The obtained pattern may be post-baked, if desired, to improve the crack resistance and the solvent resistance of the pattern, for example, at a temperature of about 150° C. to about 230° C. for a predetermined time (e.g., greater than or equal to about 10 minutes or greater than or equal to about 20 minutes). Even in the case of performing the post-bake process, the pattern obtained from the photosensitive composition has the improved thermal stability, so that the light conversion rate may be maintained at greater than or equal to about 40% of the initial value.

When a quantum dot-polymer composite obtained from the photosensitive composition is used as a color filter, two or three types of photosensitive compositions including a red quantum dot, a green quantum dot, (or optionally, a blue quantum dot) are prepared, and the patterning process is repeated for each composition to provide a quantum dot-polymer composite having a desirable pattern.

When the quantum dot-polymer composite obtained from the photosensitive composition is used as a color filter, two types of photosensitive compositions including a red quantum dot and a green quantum dot are prepared, and the patterning process is repeated for each composition to provide a quantum dot-polymer composite having a desirable pattern.

In an exemplary embodiment, a quantum dot-polymer composite pattern obtained from the photosensitive composition is provided. The photosensitive composition and the method of forming patterns are the same as described above.

Hereinafter, the embodiments are illustrated in more detail with reference to examples. However, they are exemplary embodiments of the present disclosure, and the present disclosure is not limited thereto.

EXAMPLES

Reference Example 1: Preparation of Quantum Dot-Binder Dispersion

A chloroform dispersion of green quantum dot (green light emitting, composition: InP/ZnS) including oleic acid as a hydrophobic organic ligand on the surface is prepared.

The chloroform dispersion including 50 g of quantum dot (green) including oleic acid as a hydrophobic organic ligand on the surface (converted from the optical density) is mixed with 100 g of a binder (quarternary copolymer of acrylic acid, benzyl methacrylate, hydroxyethylmethacrylate, and styrene, acid value: 130 mg KOH/g, molecular weight: 8000, acrylic acid:benzylmethacrylate:hydroxyethylmethacrylate:styrene (molar ratio percentage)=61.5%:12%:16.3%:10.2%) solution (polypropylene glycol monomethyl ether acetate having a concentration of 30 wt %) to provide a quantum dot-binder dispersion.

It is confirmed that quantum dots are uniformly dispersed in the quantum dot-binder dispersion.

Example 1

As a photopolymerizable monomer, 70 g of hexaacrylate having the following chemical structure, 15 g of a dendrimer acrylate (manufacturer: Osaka Organic Chemical, trade name: V1000) having the following chemical structure, and 15 g of a bisphenol A ethylene glycol diacrylate (manufacturer: Shin Nakamura Chemical, trade name: ABPE20) having the following chemical structure, as an initiator, an oxime ester compound, and as a light diffusing agent, $TiO_2$, and PGMEA (solvent) are mixed into the quantum dot-binder dispersion obtained from Reference Example 1 to provide a photosensitive composition:

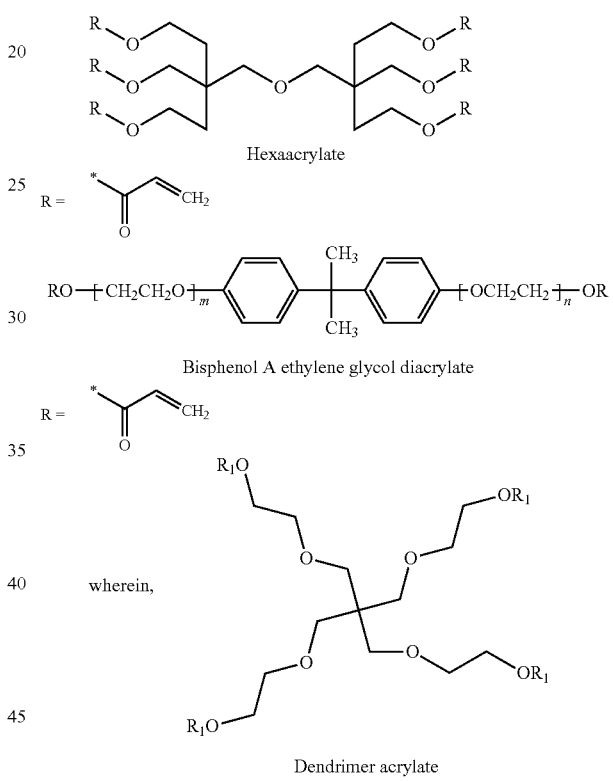

wherein,

Dendrimer acrylate wherein, in the above chemical formula, $R_1$ is as follows:

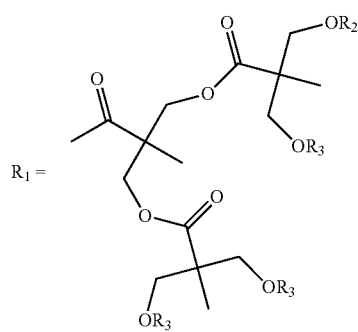

wherein, $R_2$ is hydrogen or $*-CO-CHR=CH_2$, and $R_3$ is $*-CO-CHR=CH_2$.

In the obtained composition, the content of quantum dot and light diffusing agent is 20 wt % based on the total weight of composition; the content of initiator is 0.2 wt %; and the content of photopolymerizable monomer mixture is 30 wt %.

It is confirmed that the quantum dot and the light diffusing agent are dispersed in the photosensitive composition without showing substantial agglomeration phenomenon.

Preparation of Quantum Dot-Polymer Composite Pattern

The photosensitive composition obtained from above is spin-coated on a glass substrate at 150 rpm for 5 seconds to provide a film. The obtained film is pre-baked at 100° C. for 2 minutes. The pre-baked film is irradiated with light (wavelength: 365 nm, intensity: 60 milliJoules (mJ) for 1 second under a mask having a predetermined pattern and developed by a potassium hydroxide-diluted aqueous solution (concentration: 0.043%) to provide a pattern. It is confirmed that the BP on the developing is 35 seconds.

Figure 3:
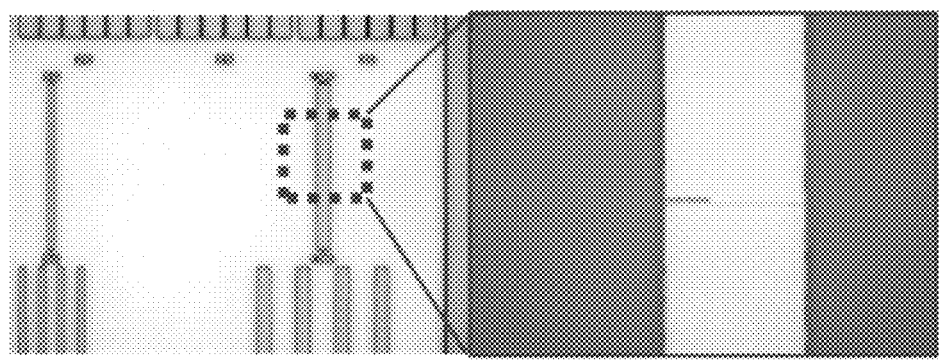
FIG. 3 is an optical microscope photograph of the quantum dot-polymer composite pattern according to Example 1, showing an enlarged image of the dotted rectangle to the right.

FIG. 3 shows an optical microscopic photograph of the obtained pattern.

From FIG. 3, it is confirmed that the composition according to Example 1 may form a pattern (line width: 110 um) including quantum dots dispersed in the polymer. It is confirmed that the formed pattern has a CDUF of 1.32%.

It is confirmed that green light is emitted from the pattern when the obtained pattern is irradiated with blue light (wavelength 450 nm).

Comparative Example 1

A photosensitive composition is prepared to form a pattern in accordance with the same procedure as in Example 1, except that 100 g of the hexaacrylate is used and the dendrimer acrylate and the bisphenol A ethylene glycol diacrylate are not used.

Figure 4:
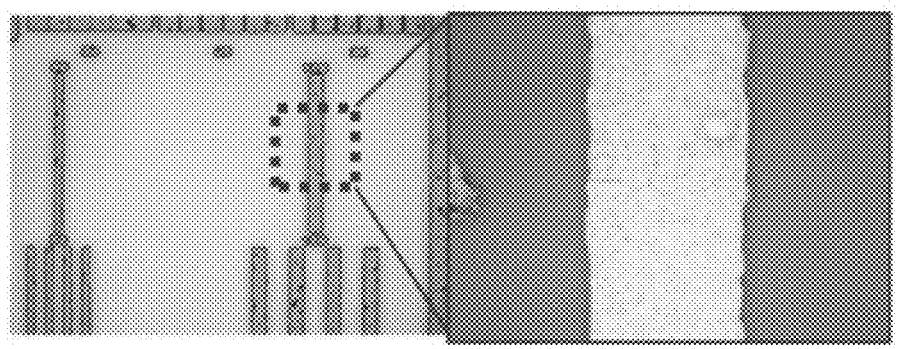
FIG. 4 is an optical microscope photograph of the quantum dot-polymer composite pattern according to Comparative Example 1 showing an enlarged image of the dotted rectangle to the right.

It is confirmed that BP is 75 seconds when the pattern is formed. FIG. 4 shows a photograph of the obtained pattern. It is confirmed that the obtained pattern has a CDUF of 4.34%.

Comparative Example 2

A photosensitive composition is prepared to form a pattern in accordance with the procedure as in Example 1, except that 70 g of the hexaacrylate and 30 g of the dendrimer acrylate are used and the bisphenol A ethylene glycol diacrylate is not used.

Figure 5:
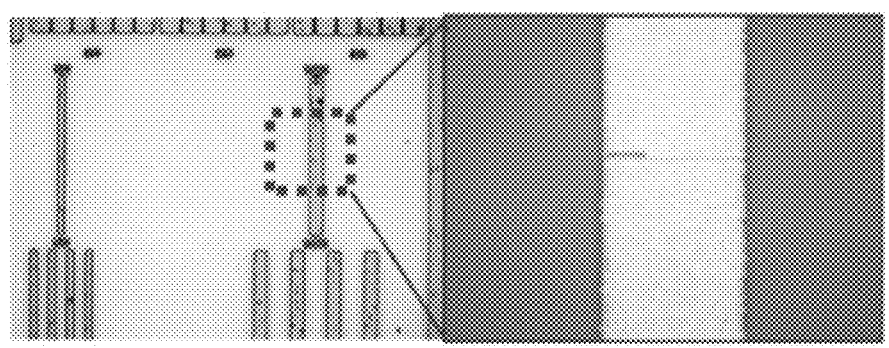
FIG. 5 is an optical microscope photograph of the quantum dot-polymer composite pattern according to Comparative Example 2 showing an enlarged image of the dotted rectangle to the right.

It is confirmed that BP is 60 seconds when the pattern is formed. FIG. 5 shows a photograph of the obtained pattern. It is confirmed that the obtained pattern has a CDUF of 2.6%.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A photosensitive composition comprising
a plurality of quantum dots comprising an organic ligand on a surface thereof;
a binder;
a photopolymerizable monomer composition;
a photoinitiator; and
a solvent,
wherein the photopolymerizable monomer composition includes a main monomer having 1 to 6 carbon-carbon double bonds, a first accessory monomer having 8 to 20 carbon-carbon double bonds, and a second accessory monomer represented by Chemical Formula A:

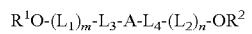    Chemical Formula A wherein, A is a C1 to C40 aliphatic hydrocarbon group, a C6 to C40 aromatic hydrocarbon group, a divalent moiety including two or more C6 to C40 aromatic hydrocarbon groups linked by a substituted or unsubstituted C1 to C10 alkylene, an ether, or a combination thereof, an ether (—O—), or a combination thereof,
$L_1$ and $L_2$ are the same or different, and are each independently a C2 to C5 substituted or unsubstituted oxyalkylene, m and n are an integer ranging from 0 to 20, provided that simultaneously m and n are not 0,
$L_3$ and $L_4$ are the same or different, and are each independently a direct bond,
O—$(CH_2)_n$—CH(OH)—$CH_2$—, or —$(CH_2)_n$—CH(OH)—$CH_2$—, and
$R^1$ and $R^2$ are the same or different, and are each independently $CR_2$=CR— (wherein, R is hydrogen or a methyl group) or $CR_2$=CRCO— (wherein, R is hydrogen or a methyl group),
wherein the main monomer comprises a (C1 to C6 alkyl) (meth)acrylate, ethylene glycol di(meth)acrylate, triethylene glycol di(meth)acrylate, diethylene glycol di(meth)acrylate, 1,4-butanediol di(meth)acrylate, 1,6-hexanediol di(meth)acrylate, neopentylglycol di(meth acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate dipentaerythritol penta(meth) acrylate, pentaerythritol hexa(meth)acrylate, trimethylolpropane tri(meth)acrylate, ethylene glycol monomethyl ether (meth)acrylate, novolac epoxy (meth)acrylate, diethylene glycol di(meth)acrylate, triethylene glycol di(meth)acrylate, propylene glycol di(meth)acrylate, tris(meth)acryloyloxyethyl phosphate, or a combination thereof,
wherein the first accessory monomer is a dendrimer (meth)acrylate monomer, and comprises 1 to 4 hydroxy groups, and
wherein the second accessory monomer is bisphenol A di(meth)acrylate, bisphenol A epoxy (meth)acrylate, a bisphenol A ethylene glycol di(meth)acrylate monomer, or a combination thereof.

2. The photosensitive composition of claim 1, wherein the organic ligand comprises RCOOH, $RNH_2$, $R_2NH$, $R_3N$, RSH, $R_3PO$, $R_3P$, ROH, RCOOR', $RPO(OH)_2$, $R_2POOH$ (wherein, R and R' are each independently a C5 to C24 aliphatic hydrocarbon group or a C5 to C20 aromatic hydrocarbon group), a polymeric organic ligand, or a combination thereof.

3. The photosensitive composition of claim 1, wherein the quantum dot comprises a Group II-VI compound, a Group III-V compound, a Group IV-VI compound, a Group IV compound, a Group I-III-VI compound, a Group I-II-IV-V compound, or a combination thereof.

4. The photosensitive composition of claim 1, wherein the binder is a carboxyl group-containing copolymer of a monomer mixture comprising a first monomer having a carboxyl group and a carbon-carbon double bond and a second monomer having a carbon-carbon double bond and a hydrophobic moiety and not having a carboxyl group, and
wherein the binder is effective to disperse the plurality of quantum dots in the photosensitive composition.

5. The photosensitive composition of claim 4, wherein the carboxyl group-containing binder is a copolymer of a monomer mixture that further comprises a third monomer having a carbon-carbon double bond and a hydrophilic moiety and not having a carboxyl group.

6. The photosensitive composition of claim 4, wherein the carboxyl group-containing binder has an acid value of greater than or equal to about 50 mg KOH/g.

7. The photosensitive composition of claim 1, wherein an amount of the main monomer is about 60 wt % to about 90 wt %, and
the sum of the first accessory monomer and the second accessory monomer is about 10 wt % to about 40 wt %, based on the total weight of the photopolymerizable monomer mixture, and
an amount of the second accessory monomer is less than or equal to about 100 parts by weight per 100 parts by weight of the first accessory monomer.

8. The photosensitive composition of claim 1, wherein the photosensitive composition further comprises a reactive compound represented by Chemical Formula 1:

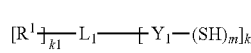

Chemical Formula 1 wherein, in Chemical Formula 1, $R^1$ is selected from hydrogen; a substituted or unsubstituted C1 to C30 linear or branched alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a C1 to C10 alkoxy group; a hydroxy group; —NH$_2$; a substituted or unsubstituted C1 to C30 amine group (—NRR', wherein R and R' are independently hydrogen or a C1 to C30 linear or branched alkyl group); an isocyanate group; a halogen; —ROR' (wherein R is a substituted or unsubstituted C1 to C20 alkylene group and $R^1$ is hydrogen or a C1 to C20 linear or branched alkyl group); acyl halide (—RC(=O)X, wherein R is a substituted or unsubstituted alkylene group and X is a halogen); —C(=O)OR' (wherein R' is hydrogen or a C1 to C20 linear or branched alkyl group); —CN; —C(=O)ONRR' (wherein R and R' are independently hydrogen or a C1 to C20 linear or branched alkyl group), or a combination thereof,
$L_1$ is a carbon atom, a substituted or unsubstituted C1 to C30 alkylene group, a substituted or unsubstituted C6 to C30 cycloalkylene group, a substituted or unsubstituted C6 to C30 arylene group, or a substituted or unsubstituted C6 to C30 heteroarylene group, wherein at least one methylene (—CH$_2$—) of the substituted or unsubstituted C1 to C30 alkylene group is optionally replaced by sulfonyl (—SO$_2$—), carbonyl (CO), ether (—O—), sulfide (—S—), sulfoxide (—SO—), ester (—C(=O)O—), amide (—C(=O)NR—) (wherein R is hydrogen or C1 to C10 alkyl group), or a combination thereof,
$Y_1$ is a single bond; a substituted or unsubstituted C1 to C30 alkylene group; a substituted or unsubstituted C2 to C30 alkenylene group; a C1 to C30 alkylene group or a C2 to C30 alkenylene group wherein at least one methylene (—CH$_2$—) is replaced by sulfonyl (—S(=O)$_2$-), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof,
m is an integer of 1 or more,
k1 is 0 or an integer of 1 or more, k2 is an integer of 1 or more, and
the sum of m and k2 is an integer of 3 or more,
provided that m does not exceed the valence of $Y_1$ when $Y_1$ is not a single bond and provided that the sum of k1 and k2 does not exceed the valence of Lt.

9. The photosensitive composition of claim 8, wherein the reactive compound is ethoxylated pentaerythritol tetra (3-mercaptopropionate), trimethylolpropane tri(3-mercaptopropionate), trimethylolpropanetri(2-mercaptoacetate), glycol di-3-mercaptopropionate, polypropylene glycol di-3-mercaptopropionate, ethoxylated trimethylpropane tri (3-mercaptopropionate), glycol dimercaptoacetate, ethoxylated glycol dimercaptoacetate, 1,4-bis (3-mercaptobutyryloxy)butane, trimethylolpropane tris (3-mercaptopropionate), tris[2-(3-mercaptopropinonyloxy)ethyl] isocyanurate, 1,3,5-tris (3-mercaptobutyloxyethyl)-1,3,5-triazine-2,4,6(1H,3H,5H)-trione, pentaerythritol tetrakis (3-mercaptopropionate), pentaerythritol tetrakis (2-mercaptoacetate), 1,6-hexanedithiol, 1,3-propanedithiol, 1,2-ethanedithiol, ethylene glycol polyethylene glycol dithiol including 1 to 10 ethylene glycol repeating units, or a combination thereof.

10. The photosensitive composition of claim 1, wherein the photosensitive composition is developable by an alkali aqueous solution.

11. The photosensitive composition of claim 1, wherein the photosensitive composition further comprises a light diffusing agent selected from a metal oxide particle, a metal particle, and a combination thereof.

12. The photosensitive composition of claim 1, wherein photosensitive composition comprises
about 1 wt % to about 40 wt % of the quantum dot;
about 0.5 wt % to about 35 wt % of the binder;
about 1 wt % to about 25 wt % of the photopolymerizable monomer composition; and
about 0.01 wt % to about 10 wt % of the photoinitiator; and
a balance amount of the solvent, each based on the total weight of the composition.

13. The photosensitive composition of claim 1, wherein when the photosensitive composition is exposed under a pattern and is developed, a breakpoint time to show a pattern is less than or equal to about 60 sec.

14. The photosensitive composition of claim 1, wherein the photosensitive composition has critical dimension uniformity of less than or equal to about 5%.

* * * * *